Figure 1:
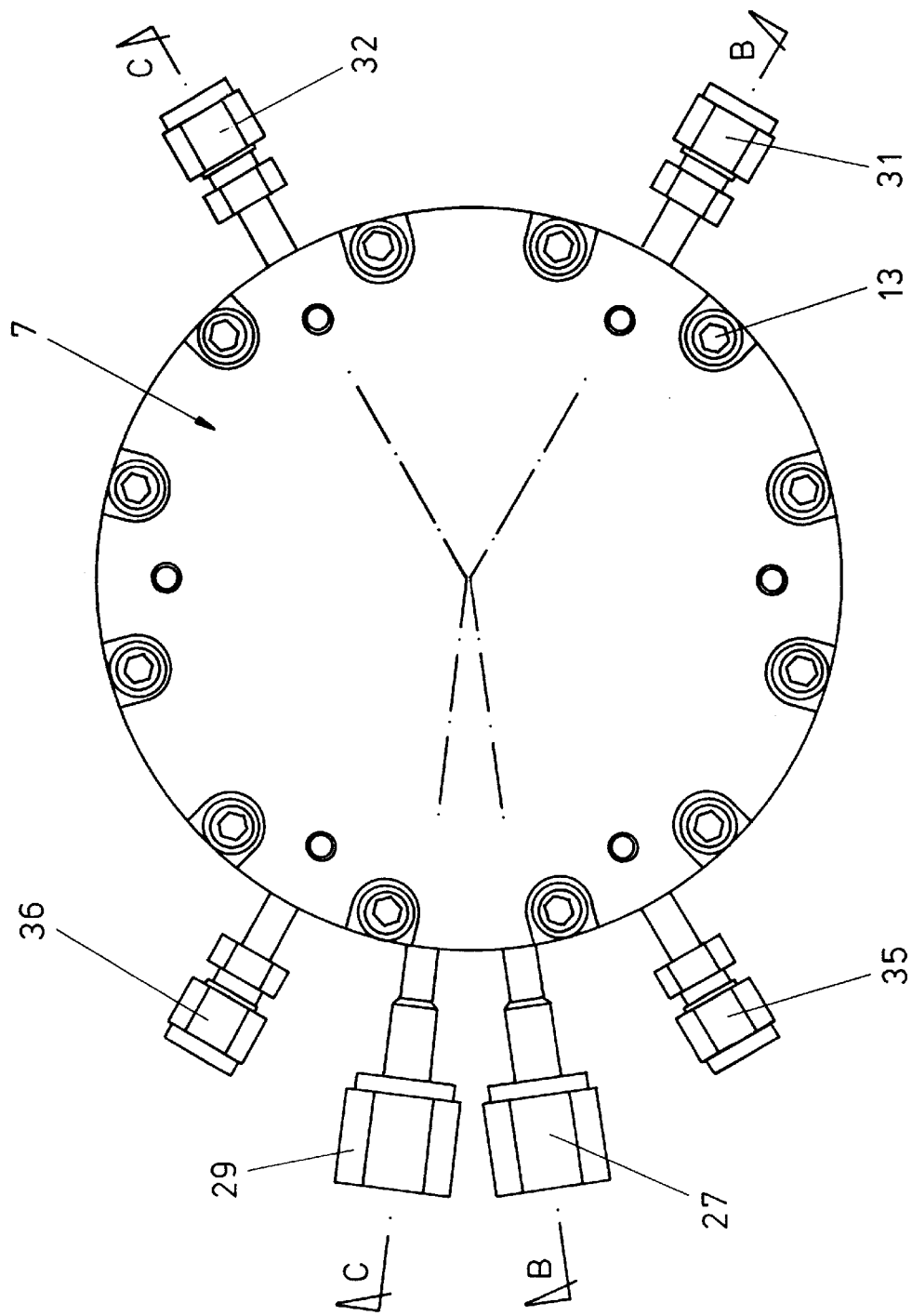

US005871586A

United States Patent [19]
Crawley et al.

[11] Patent Number: 5,871,586
[45] Date of Patent: Feb. 16, 1999

[54] CHEMICAL VAPOR DEPOSITION

[75] Inventors: John A. Crawley, Royston; Victor J. Saywell, Cottenham, both of United Kingdom

[73] Assignee: T. Swan & Co. Limited, Consett, United Kingdom

[21] Appl. No.: 833,766

[22] Filed: Apr. 9, 1997

Related U.S. Application Data

[63] Continuation of Ser. No. 490,311, Jun. 14, 1995, abandoned.

[30] Foreign Application Priority Data

Jun. 14, 1994 [GB] United Kingdom .................. 9411911

[51] Int. Cl.$^6$ .................................................. C23C 16/00
[52] U.S. Cl. ......................................... 118/715; 118/724
[58] Field of Search .................................. 118/724, 715, 118/725; 204/298.07

[56] References Cited

U.S. PATENT DOCUMENTS

| | | | |
|---|---|---|---|
| 3,854,443 | 12/1974 | Baerg | 118/49 |
| 4,051,382 | 9/1977 | Ogawa | 250/531 |
| 4,340,568 | 7/1982 | Hirai | 422/245 |
| 4,368,689 | 1/1983 | Jones | 118/588 |
| 4,468,283 | 8/1984 | Ahmed | 156/642 |
| 4,574,093 | 3/1986 | Cox | 427/86 |
| 4,951,603 | 8/1990 | Yoshino et al. | 118/719 |
| 4,997,677 | 3/1991 | Wang et al. | 427/248.1 |
| 5,226,383 | 7/1993 | Bhat | 118/730 |
| 5,322,568 | 6/1994 | Ishihara | 118/715 |
| 5,422,139 | 6/1995 | Fischer | 427/248.1 |
| 5,505,778 | 4/1996 | Ono | 156/625 |
| 5,551,982 | 9/1996 | Anderson | 118/715 |

FOREIGN PATENT DOCUMENTS

| | | | |
|---|---|---|---|
| 60-207332 | 4/1985 | Japan . | |
| 60-175412 | 9/1985 | Japan . | |
| 60-065798 | 10/1985 | Japan . | |
| 61-101020 | 5/1986 | Japan | 156/345 |
| 1-223724 | 9/1989 | Japan | 118/715 |
| 2-234419 | 9/1990 | Japan | 118/725 |
| 3-170675 | 7/1991 | Japan | 118/725 |
| 2219311 | 12/1989 | United Kingdom . | |

OTHER PUBLICATIONS

Fifth Biennial Workshop, Panama City Beach, Florida, Apr. 14–17, 1991 (article by Vernon et al. on Close–Space MOCVD Reactors).
Journal of Crystal Growth 79 (1986) 900–908 (Article by Cox et al. on Vapour Levitation Epitaxy).
Journal of Electronic Materials vol. 16 No. 6 1987 pp. 397 to 403 (Article by Osinski et al on Vapour Levitation Epitaxy).
Solar Cells, 30 (1991) 323–335 (Article by Chinoy et al on Epitaxial Solar Cell Materials Reactor).

*Primary Examiner*—R. Bruce Breneman
*Assistant Examiner*—Jeffrie R. Lund
*Attorney, Agent, or Firm*—Emrich & Dithmar

[57] ABSTRACT

Chemical vapor deposition reactions are carried out by introducing first and second precursors for the material to be deposited into a reaction chamber (5) along a plurality of separate discrete paths (21,24) where they are cooled prior to entry into the reaction chamber. The precursors are mixed in the reaction chamber which contains a heated substrate (4) and react to deposit the material on the substrate.

4 Claims, 12 Drawing Sheets

CHEMICAL VAPOR DEPOSITION

This is a continuation of application Ser. No. 490,311, filed Jun. 14, 1995, abandoned.

This invention relates to chemical vapour deposition and more particularly, but not exclusively, is concerned with metal organic chemical vapour deposition (MOCVD).

MOCVD is a well known technique which is ordinarily used to achieve epitaxial growth of semi-conductor and high temperature superconductor compounds such as GaAs, GaAlAs, InP and InGaAlP. When producing such compounds, appropriate precursors are mixed together and heated in the presence of a suitable substrate so that the compound is formed by reaction of the precursors and is deposited on the substrate such that the crystal orientation of the deposited layer is the same as that of the substrate.

The resultant materials have a wide range of electronic and opto-electronic applications including the production of light emitting diodes (LEDs) and laser diodes. The wavelength of these devices is determined by the band gap of the deposited material which is dependent on its composition. Generally, for compositions containing Ga, Al, In, P and As, the emission is within the spectral range extending from green to the mid infra-red. Additionally, there is a requirement for emission in the blue region of the spectrum but there have been technological difficulties in fabricating devices within the group III–V semiconductor field despite the theoretical suitability of gallium nitride in particular. Consequently, other material systems have been used to manufacture blue devices such as SiC and ZnSe. These materials are not very efficient and there are process advantages in producing all devices from the same basic material system regardless of wavelength.

It is known to provide reactors for MOCVD having various geometric configurations. For example, in one type of reactor, a horizontal tube is provided having an inlet zone at one end wherein the gaseous precursors are mixed and including a reaction chamber containing a heated horizontally disposed substrate so that the mixed precursors and a carrier gas from the inlet zone can pass over the substrate. The precursors are decomposed in the reaction chamber and deposit epitaxially on to the substrate. In an alternative arrangement, the reactor includes a vertical tube and the mixture of gaseous precursors is introduced in an inlet zone at the top. The gas mixture then passes down the tube and over a horizontally disposed substrate located in a reaction chamber and thence to an exhaust port in an outlet zone at the bottom of the tube. It is also known to provide multiple wafer designs wherein the substrate may be rotated to improve uniformity of thickness and composition of the deposited layer.

Generally the precursors used do not react together before the precursor mixture is heated. Thus, good mixing of the precursors (which is essential for good homogeneity in the deposited layer) can be achieved prior to the mixture being heated to form the desired material. Hence, in such conventional reactors, the gaseous precursors are mixed together in a cold part of the reactor remotely from the heated substrate and are then conveyed together along a conduit to the heated substrate located in the reaction chamber.

It has been reported that the growth of good quality Ga, In, As and P having uniform thickness and composition can be achieved using a water cooled close coupled injector wherein appropriate gaseous precursors containing Ga, In, As and P are mixed together and the mixture is then injected into a reaction chamber containing the substrate through many hundreds of holes located very close to the substrate. However, since this technique involves mixing the precursors remotely from the substrate, it is not suitable for the production of gallium nitride and the like whose precursors would react prior to reaching the substrate which would make it difficult to control the composition of the deposited material.

It is an object of the present invention to overcome the above disadvantage by separately introducing the gaseous precursors into the reaction chamber where they are then mixed to form a homogenous mixture at a location very close to the heated substrate so that the desired deposition can then take place.

Accordingly, a first aspect of the present invention provides a reactor for producing a material from first and second gaseous precursors by chemical vapour deposition, which reactor comprises:

(1) a reaction chamber for accommodating a heated substrate upon which said material is to be deposited by reaction of said precursors, (2) a first chamber for the first precursor, (3) a second chamber for the second precursor, (4) a plurality of first conduits connecting the first chamber with the reaction chamber to provide discrete paths along which the first precursor can pass to the reaction chamber, (5) a plurality of second conduits connecting the second chamber with the reaction chamber to provide discrete paths along which the second precursor can pass to the reaction chamber whereby contact between said first and second precursors does not occur until the precursors enter the reaction chamber, and (6) a means for cooling said first and second conduits.

According to a second aspect of the present invention there is provided a method of producing a material by reaction of first and second gaseous precursors by chemical vapour deposition which method comprises cooling said first and second precursors, passing said cooled precursors separately along a plurality of discrete paths, and injecting said precursors into a reaction chamber containing a heated substrate upon which said material is to be deposited so that mixing of said precursors occurs in said reaction chamber in the presence of said substrate to form a deposit of said material on said substrate.

One or both of the first and second precursors may be in the form of a single precursor or in the form of a mixture of substances which is chemically stable.

By providing a large number of paths whereby the precursors enter the reaction chamber, a homogenous mixture of the first and second precursors can be readily formed in the reaction chamber in close proximity to the substrate.

In a particularly preferred embodiment, the conduits of the first chamber pass through the second chamber in which case it is convenient for the first and second chambers to share a common dividing wall.

In a further preferred embodiment, the reactor includes an additional chamber for additional gas and a plurality of third conduits is provided between the third chamber and the reaction chamber to provide discrete paths along which the additional gas can pass to the reaction chamber. By interspersing the outlets of the third conduits between the outlets of the first and second conduits the respective outlets of the first, second and third conduits can be distributed uniformly across the reaction chamber and the gas emanating from the outlets of the third conduits separates the first and second precursors emanating from the outlets of the first and second conduits for a period of time and thereby defers the mixing of the first and second precursors until they are nearer the surface of the heated substrate on which the material is to be deposited.

If desired, the reaction chamber may be such as to accommodate more than one substrate.

Figure 2:
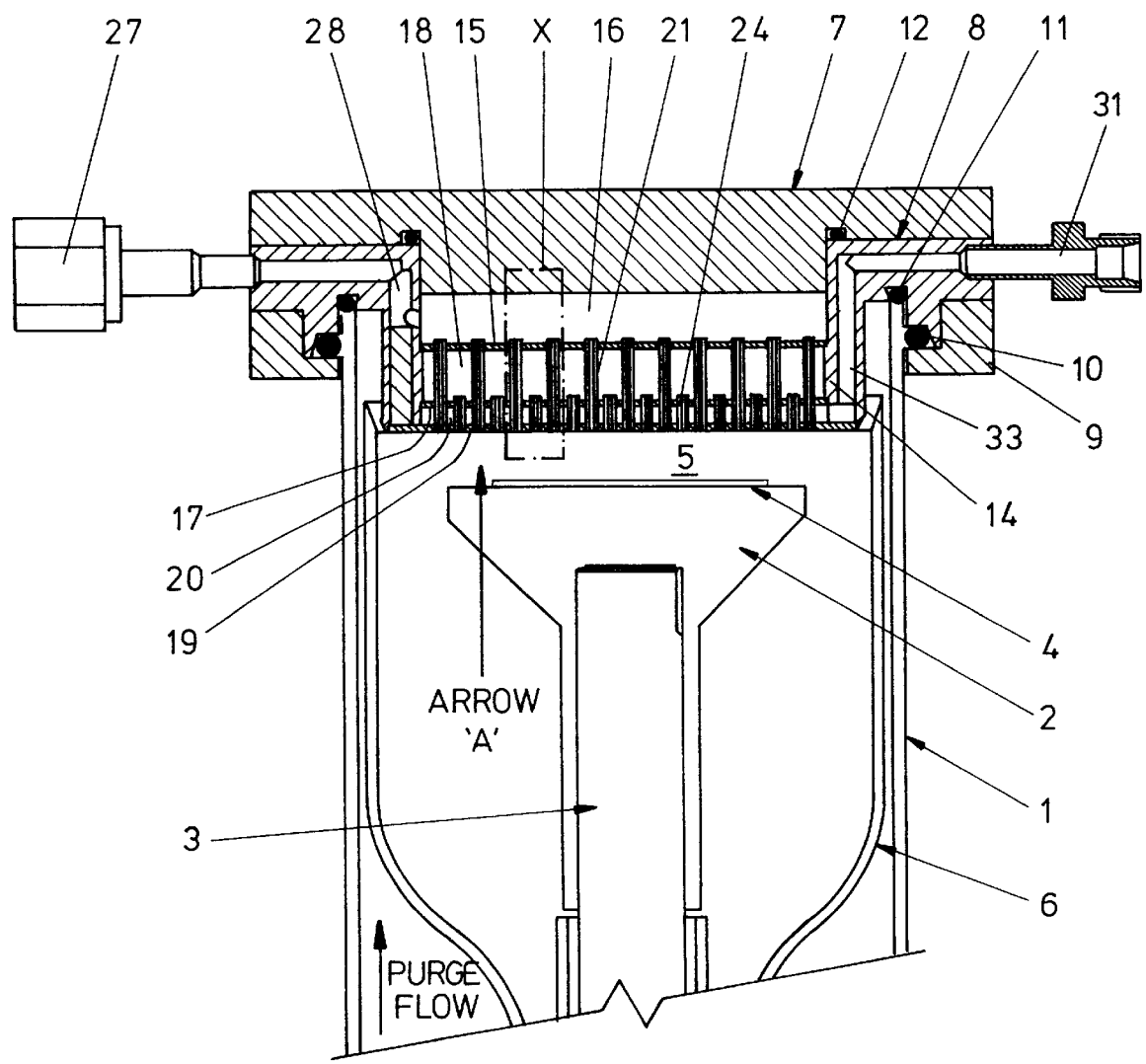
Figure 3:
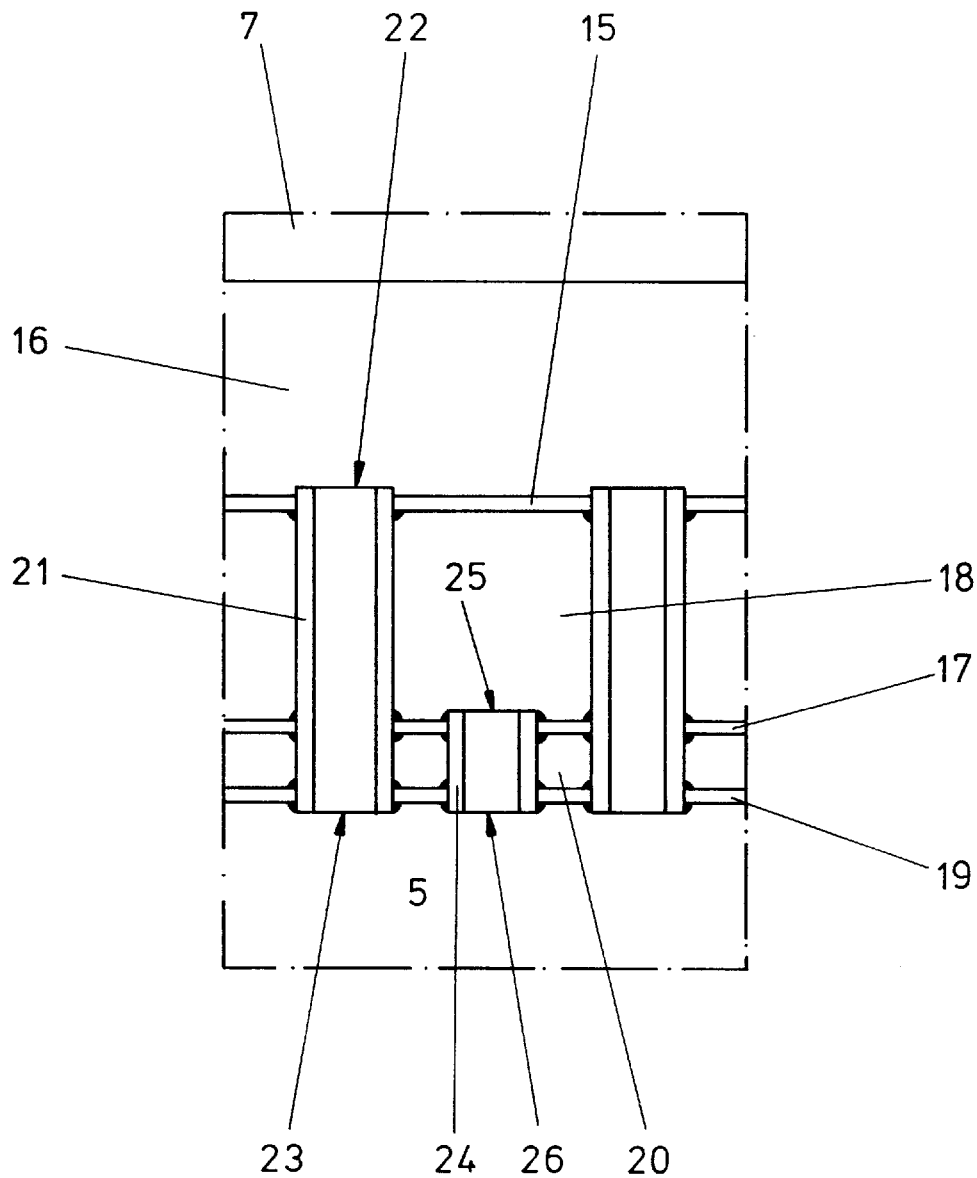
Figure 4:
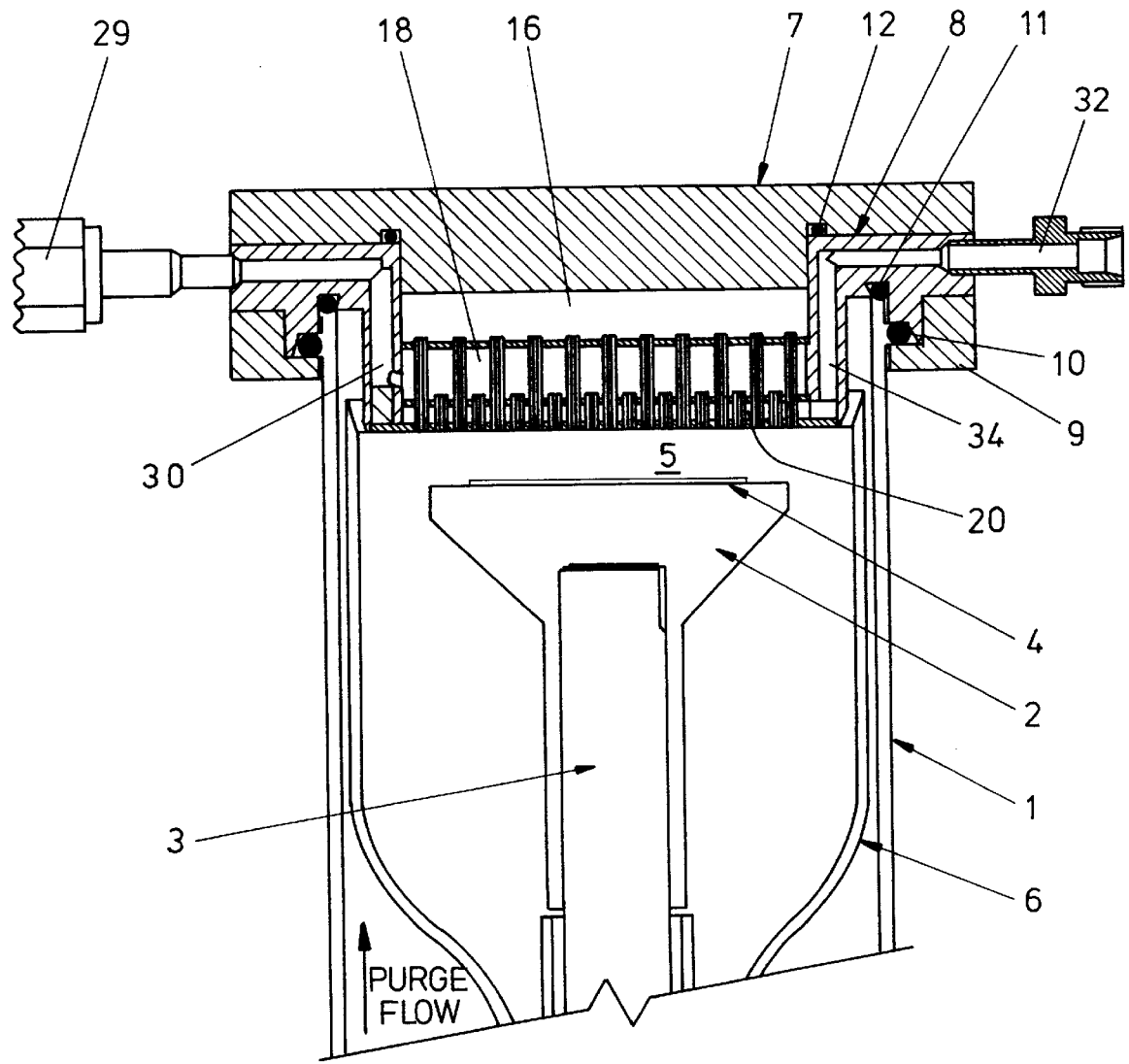
Figure 5:
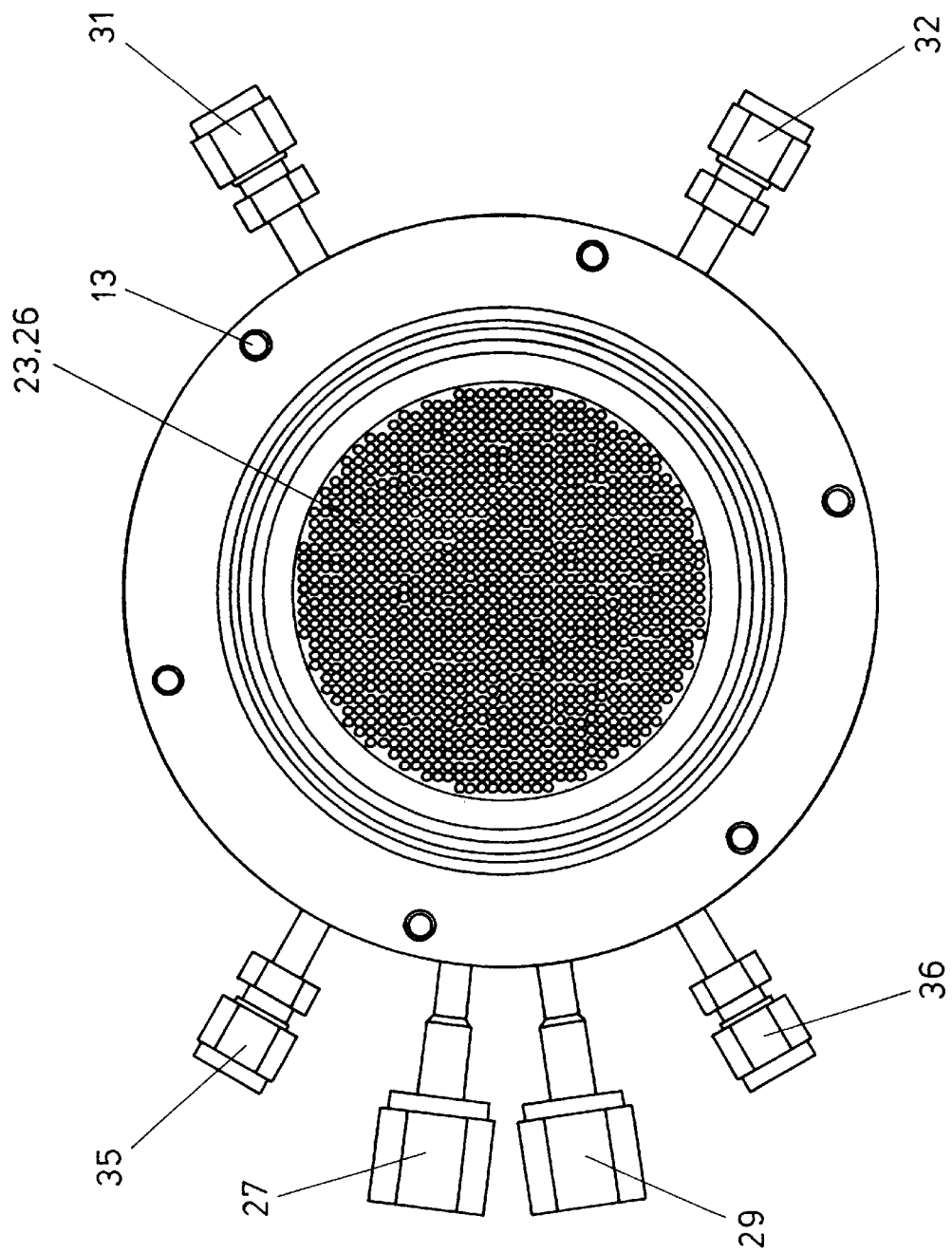
Figure 6:
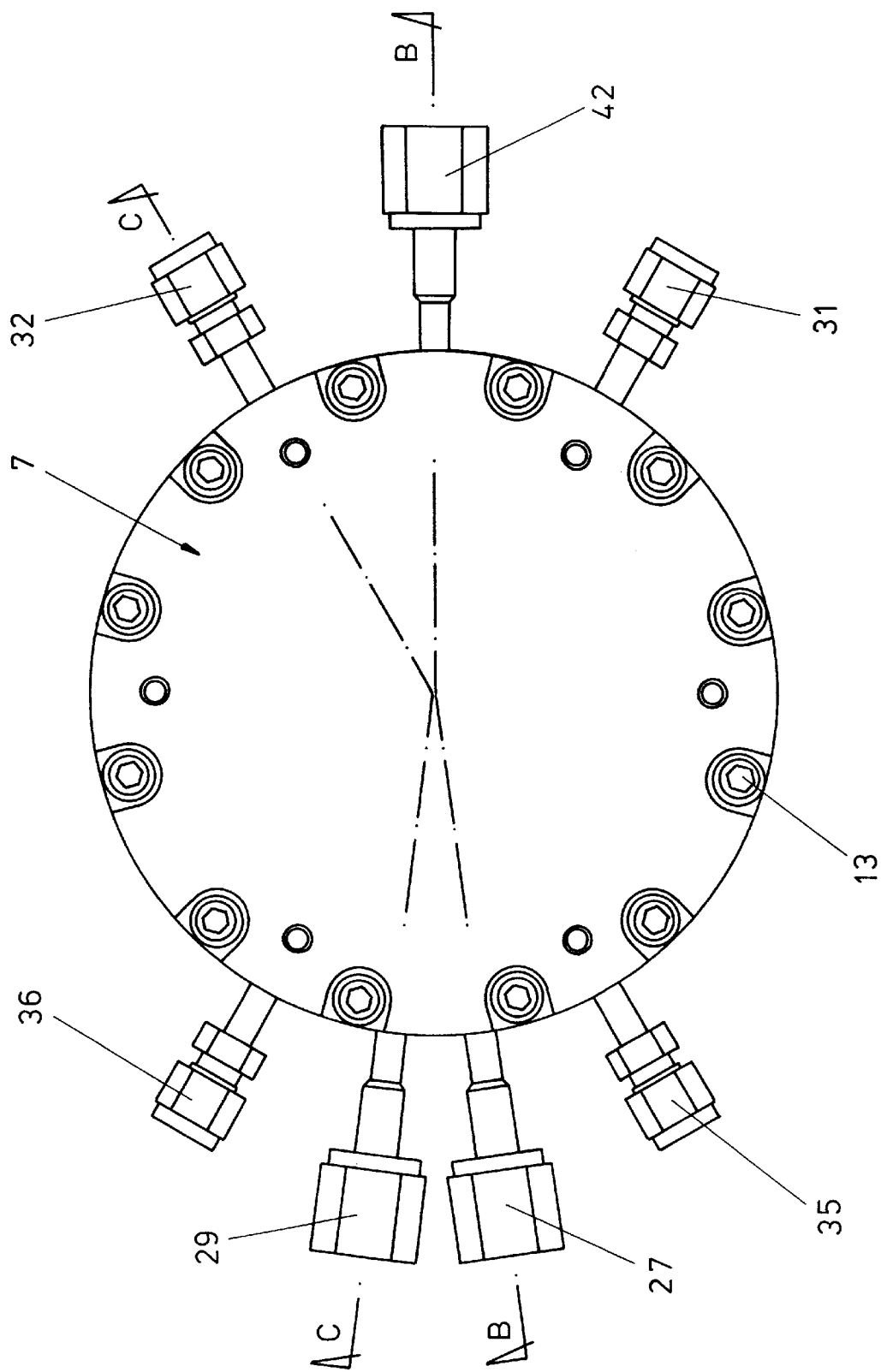
Figure 7:
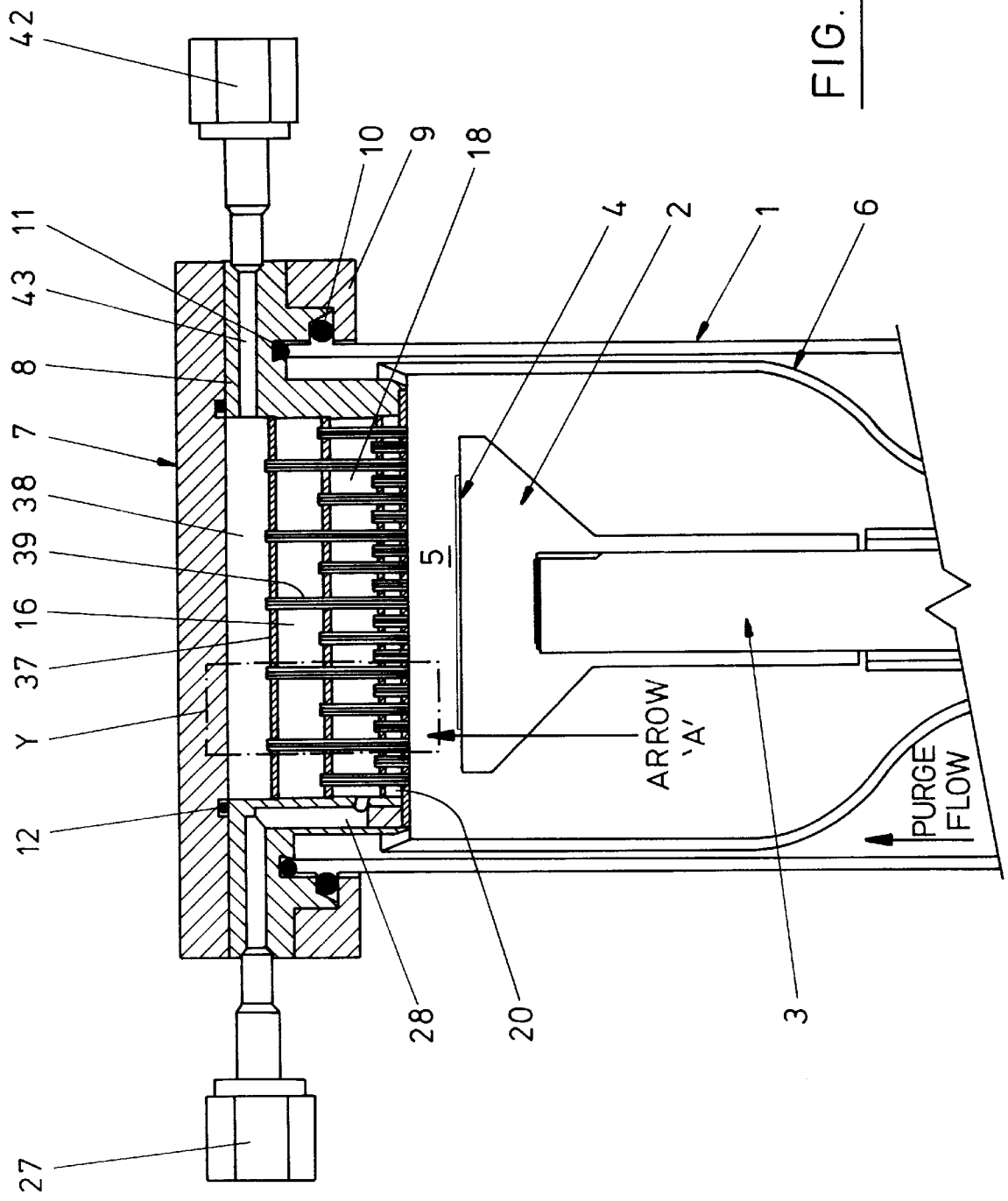
Figure 8:
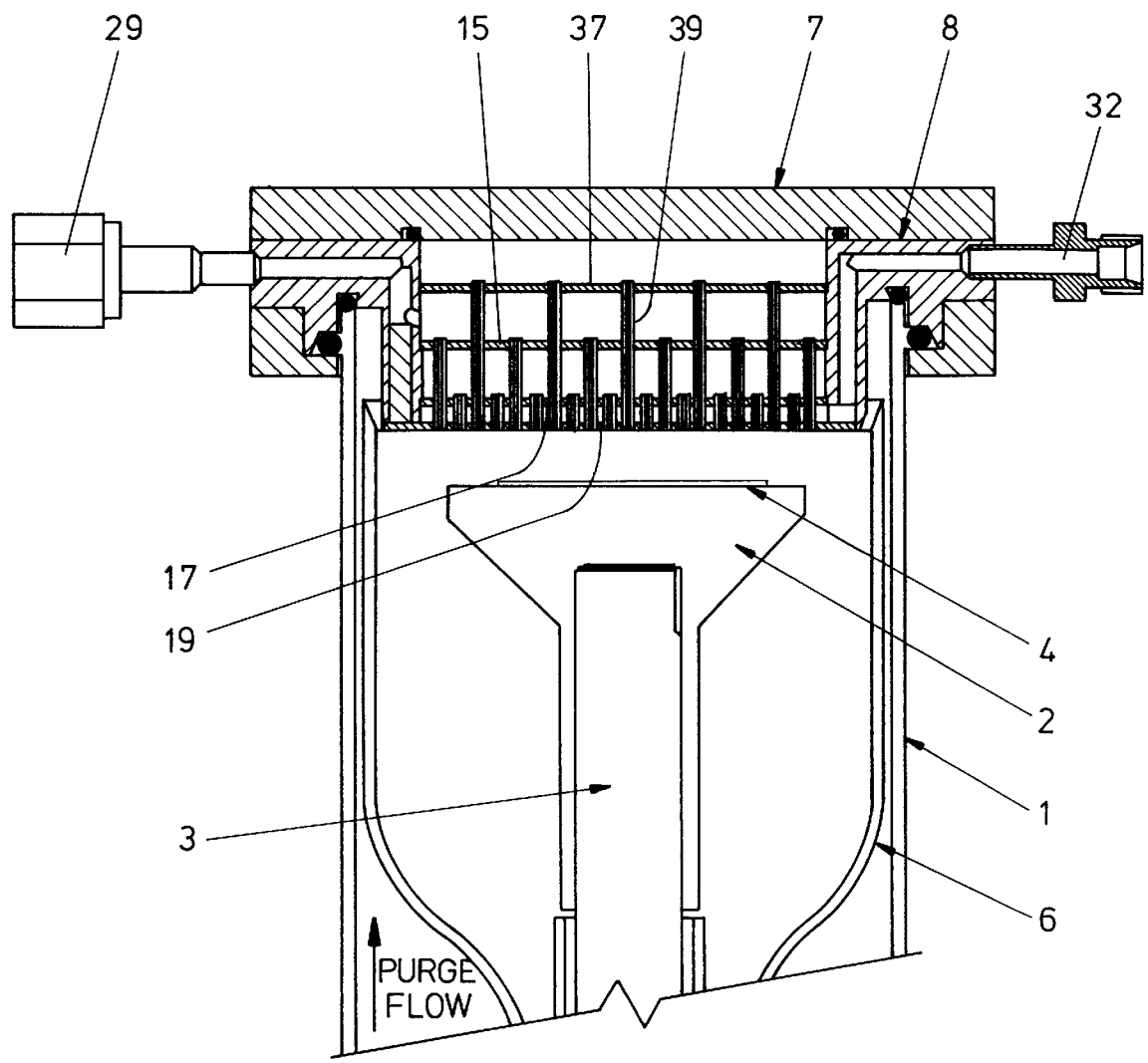
Figure 9:
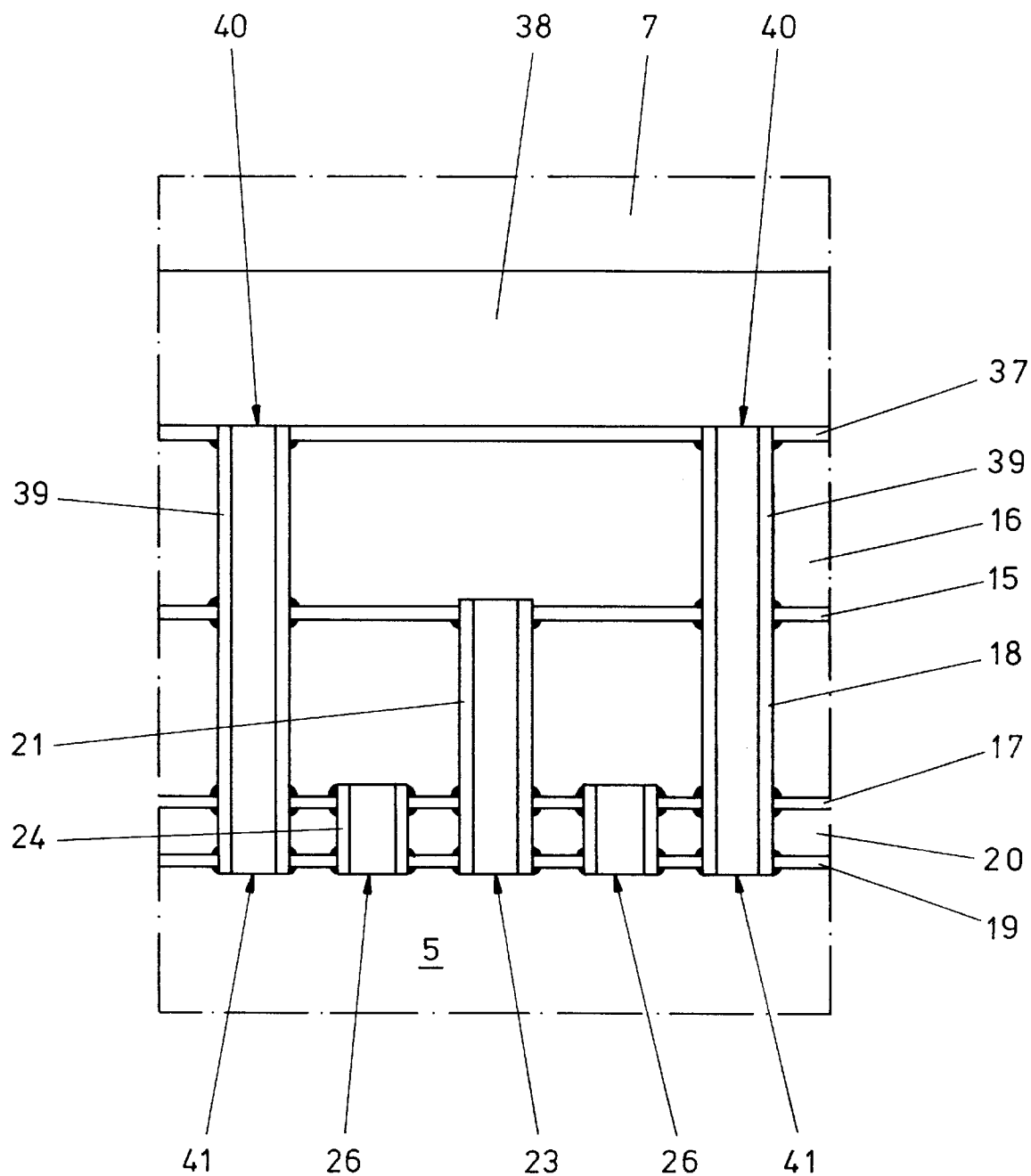
Figure 10:
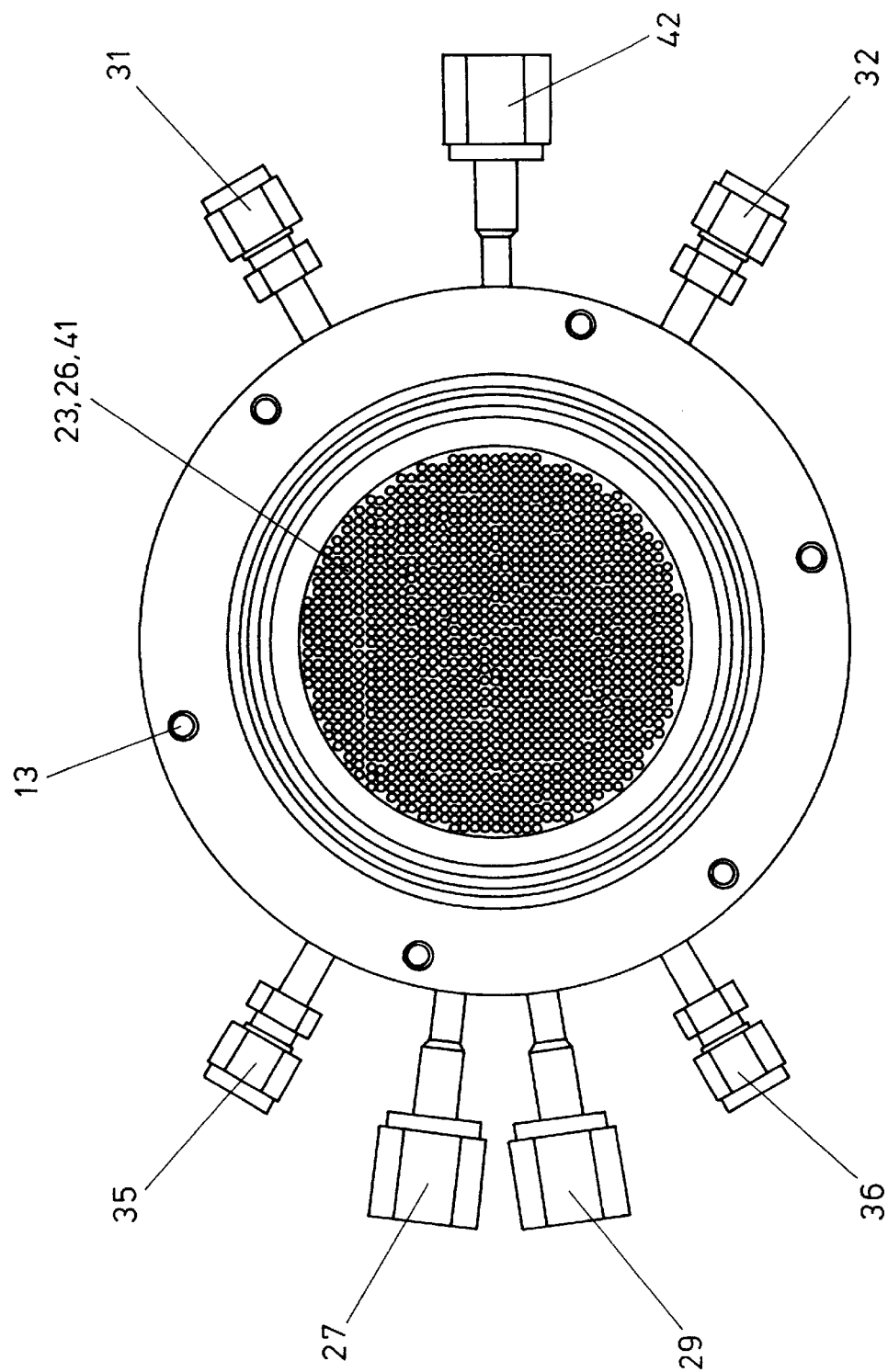
Figure 11:
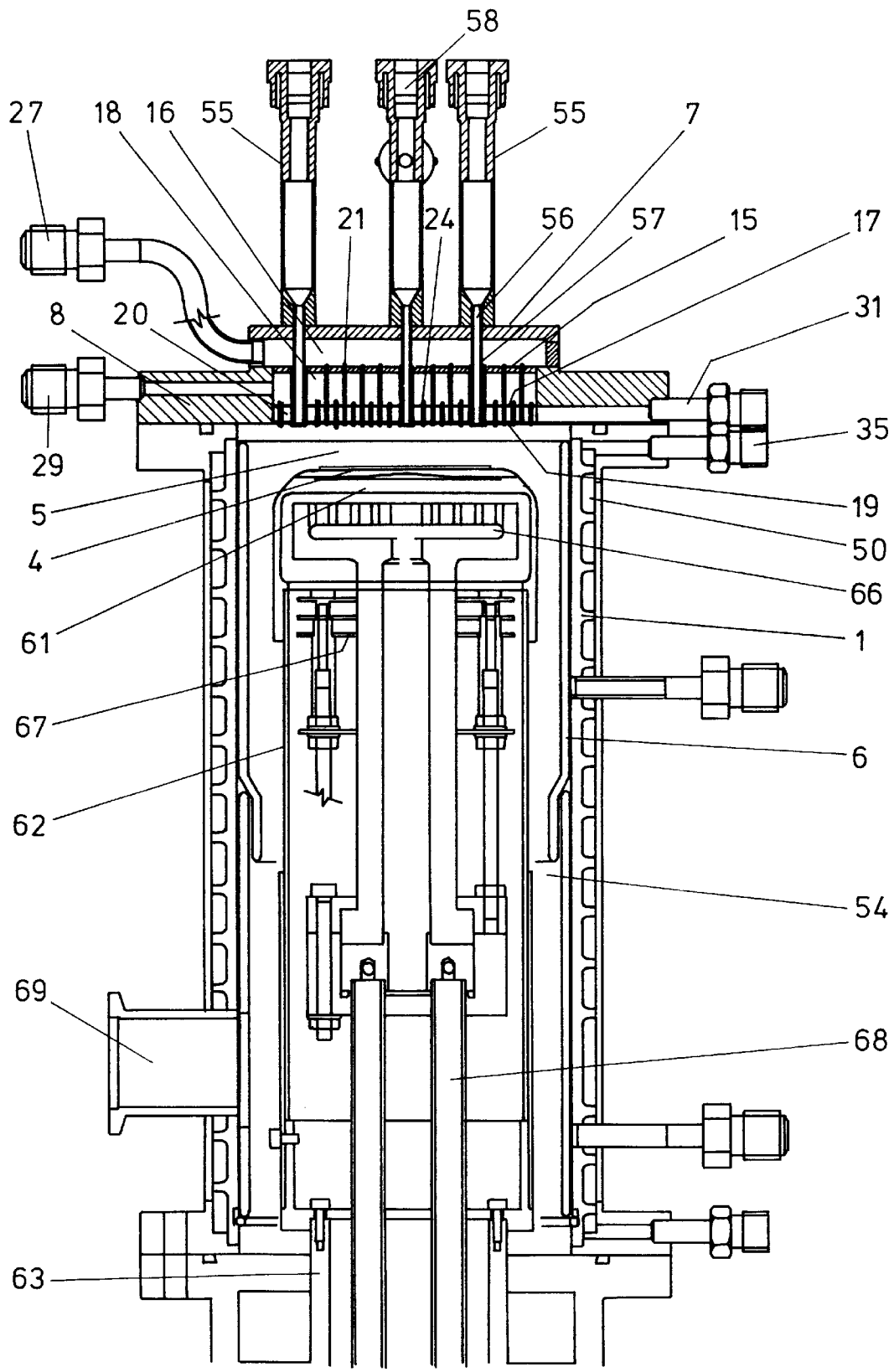
Figure 12:
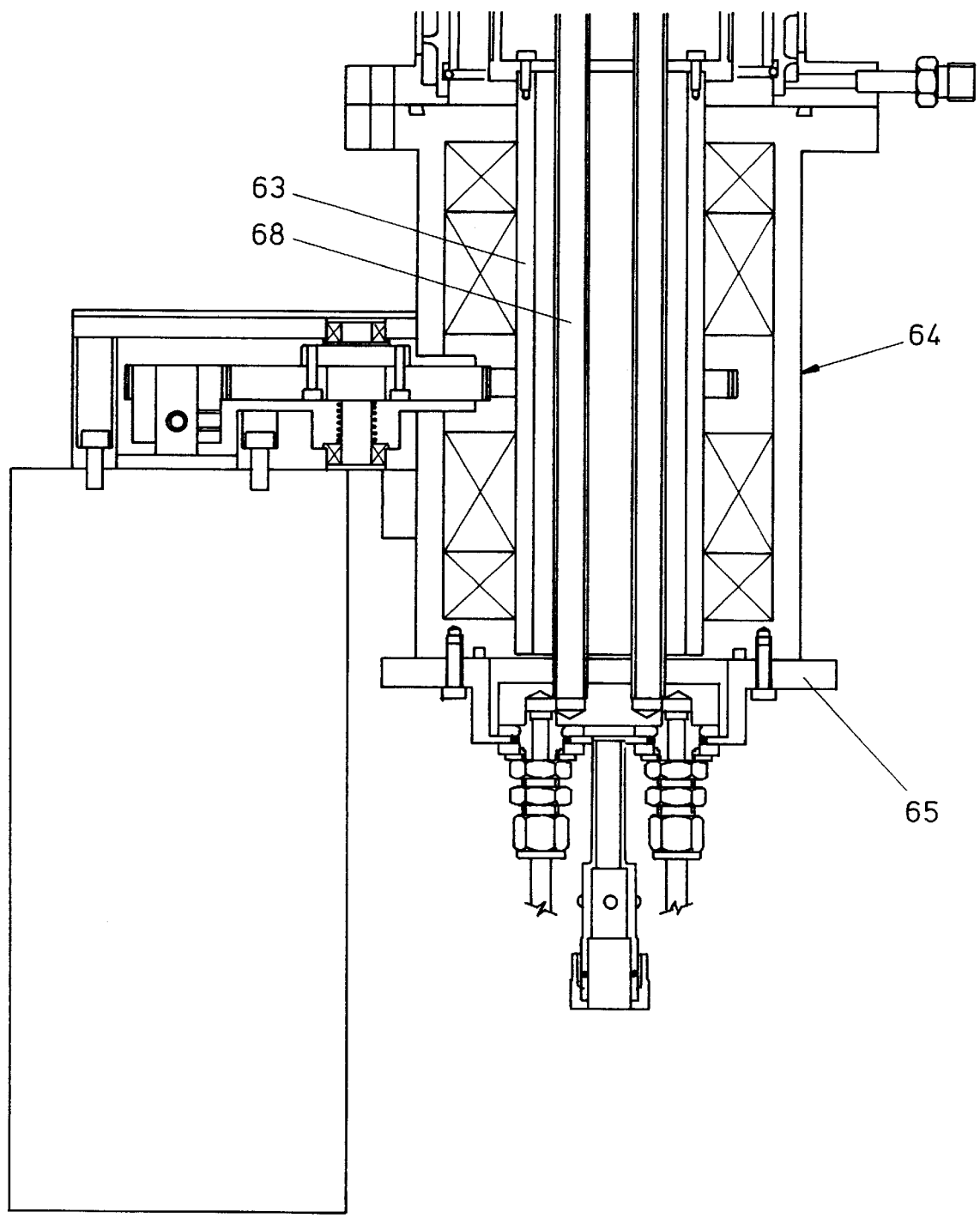

For a better understanding of the invention and to show how the same may be carried into effect, reference will now be made, by way of example, to the accompanying schematic drawings in which:

FIG. 1 is a plan view of a MOCVD reactor in accordance with a first embodiment of the present invention, FIG. 2 is a section through the reactor of FIG. 1 along the line B—B, FIG. 3 shows, on a larger scale, the part bounded by chain-dotted line X in FIG. 2, FIG. 4 is a section through the reactor of FIG. 1 along the line C—C, FIG. 5 is an underneath view of the reactor of FIG. 1 in the direction indicated by arrow A, FIG. 6 is a plan view of a reactor in accordance with a second embodiment of the present invention, FIG. 7 is a section through the reactor of FIG. 6 along line B—B, FIG. 8 is a section through the reactor of FIG. 6 along line C—C, FIG. 9 shows, on a larger scale, the part bounded by chain-dotted line Y in FIG. 8, FIG. 10 is an underneath view of the reactor of FIG. 6 in the direction of arrow A, FIG. 11 is a schematic vertical section through the upper part of a MOCVD reactor in accordance with a third embodiment of the present invention, and FIG. 12 is a schematic vertical section through the lower part of the reactor of FIG. 11.

Referring now to FIGS. 1 to 5, the reactor comprises a generally vertical tube having cylindrical walls 1 typically formed of quartz. Located centrally within the tube is a susceptor (or thermal absorber) 2 mounted on a susceptor support 3. The susceptor 2 terminates in a horizontal surface upon which a substrate 4 (in the form of one or more wafers) is placed so that it can be heated by contact with the susceptor to a temperature above that at which the precursors decompose and react. The heating of the susceptor may be by, for example, induction heating, radiation heating or resistance heating as desired. The upper end of the reactor is closed by a closure assembly through which process and carrier gases may be introduced into the reactor chamber 5 located between the closure assembly and the horizontal surface of the susceptor where the MOCVD process takes place. The process and carrier gases are exhausted from the reactor chamber 5, typically at a reduced pressure, via a gap between a generally cylindrical liner 6 in the reactor and the susceptor support 3 and a means may be provided (not shown) to introduce a small flow of purging gas such as inert gas or hydrogen between the liner 6 and the reactor walls 1 and thence into the reactor chamber 5 for subsequent exhaustion between the liner 6 and the susceptor support 3. The purpose of the purge flow is to maintain the reactor chamber 5 in a clean condition and the liner 6 is suitably profiled so that the exhaust gases are symmetrically removed from the reactor chamber 5.

The susceptor support 3 may include a means (not shown) of measuring the substrate temperature. If, however, the support is formed from quartz, the temperature may be measured optically. Also, if desired, the susceptor support 3 may be rotatable about the longitudinal axis of the tubular reactor so that the substrate is rotated during the MOCVD process. In this way, the uniformity of thickness and the uniformity of composition of the material deposited on the substrate can be improved.

The closure assembly incorporates a means of introducing the carrier and precursor gases into the reactor chamber 5 while maintaining the gas integrity of the chamber. Thus, the closure assembly includes a top closure plate 7, an injector assembly 8, and a clamping ring 9. A seal 10, e.g. an O-ring seal, is provided between the injector assembly 8 and the outer surface of the reactor wall 1, a seal 11, e.g. an O-ring seal, is provided between the injector assembly 8 and the free end of the reactor wall 1, and a seal 12, e.g. an O-ring seal, is provided between the top closure plate 7 and the injector assembly 8. These seals are maintained in compression by a plurality of bolts 13.

The injector assembly 8 includes a tubular portion having cylindrical walls 14 and located co-axially with respect to reactor walls 1. Three plates which are preferably essentially circular, as shown, are sealed across the tubular portion 14 in spaced parallel relationship. The first (upper) plate 15 defines, with the top closure plate 7, a first chamber 16. The second (center) plate 17 defines, with the first plate 15 a second chamber 18. Thus the first plate 15 provides a common dividing wall between the first chamber 16 and the second chamber 18. The third (lower) plate 19 forms, with the centre plate 17, a coolant chamber 20. The distance between the lower surface of plate 19 and the upper surface of the substrate 4 on the susceptor may be, for example, from 0.5 cm to 10 cm as desired.

A plurality of first conduits 21 is provided between the first chamber 16 and the reaction chamber 5. They have inlets 22 located in the first chamber 16 and pass through chambers 18 and 20 without communicating therewith. They are bonded to the plates 15, 17 and 19 by, for example, vacuum brazing. The conduits terminate in outlets 23 in the form of injector nozzles in the reaction chamber 5 and provide a plurality of discrete paths from the first chamber 16 to the reaction chamber 5.

A plurality of second conduits 24 is provided each having an inlet 25 in the second chamber 18 and an outlet 26 in the form of an injector nozzle in the reaction chamber 5. These conduits pass through the coolant chamber 20 without communicating with it and are bonded to the plates 17 and 19, by for example vacuum brazing. The outlets 23 and 26 of the first and second conduits 21 and 24 are uniformly distributed over the surface of the third plate 19 so that each outlet 23 is surrounded by several outlets 26 and vice versa.

The injector assembly 8 includes (i) a first inlet 27 which is in communication with a gallery 28 in the injector assembly 8 which in turn communicates with the first chamber 16 (see FIG. 2) and (ii) a second inlet 29 which communicates with a gallery 30 in the injector assembly 8 which in turn communicates with the second chamber 18 (see FIG. 4). The first inlet 27 is for a first precursor (e.g. ammonia) and carrier gas and the second inlet 29 is for a second precursor (e.g. trimethyl or triethyl gallium) and carrier gas.

The injector assembly 8 includes third and fourth inlets 31 and 32 for the introduction of coolant (e.g. water) into the assembly. The inlets 31 and 32 are in communication with galleries 33 and 34 respectively which in turn communicate with the coolant chamber 20. The injector assembly 8 also includes coolant outlets 35 and 36 which are similarly linked by galleries in the injector assembly 8 to the coolant chamber 20 whereby the coolant can be continuously passed through the injector assembly. The coolant passing through the coolant chamber 20 contacts the outer surfaces of the conduits 21 and 24 passing through the chamber 20 and thereby cools the gases passing through the conduits.

In use, the first precursor is injected into the reaction chamber 5 via inlet 27, first chamber 16 and first conduits 21 and the second precursor is injected into the reaction chamber 5 through inlet 29, second chamber 18 and second conduits 24. Thus the precursors are separate and cool until they enter the reaction chamber 5. By suitably distributing the conduit outlets over the bottom plate 19 the contact between the precursors can be minimized until they are close to the surface of the heated substrate 4. There they are rapidly mixed together to form a homogenous mixture because of the presence of the large number of injection points. This mixture is then presented to the heated substrate where the chemical vapour deposition reaction takes place. In the example, given, a uniform layer of gallium nitride is thus deposited on the surface of the substrate 4.

Referring now to FIGS. 6 to 10, parts corresponding to parts of FIGS. 1 to 5 are denoted by like reference numerals.

In this case, the injector assembly 8 includes a further disc like plate 37 sealed across the tubular portion 14 so as to produce a third gas chamber 38 in the injector assembly. A plurality of third conduits 39 is provided having inlets 40 communicating with the third gas chamber 38 and outlets 41 in the form of nozzles communicating with the reaction chamber 5. As in the case of the first and second conduits, the third conduits 39 are bonded to the plates through which they pass by, for example, vacuum brazing. Also, they do not communicate with chambers 16, 18 and 20. The injector assembly 8 includes a further inlet 42 communicating with a gallery 43 which in turn communicates with the chamber 38 whereby hydrogen or other suitable gas may be introduced into chamber 38. This gas then passes along the third conduits 39 and into the reaction chamber 5 without contact with the precursors until all three gases enter the reaction chamber 5. The location of the outlets 41 of the third conduits is such that the hydrogen emanating therefrom separates the precursor gas streams so that they do not contact one another at the injector nozzles 23 and 26. In this way, the possibility of surface enhanced reactions is reduced.

Referring now to FIGS. 11 and 12, parts corresponding to parts of FIGS. 1 to 10 are denoted by like reference numerals.

In this embodiment, the reactor comprises a generally vertical tube having cylindrical walls 1 formed of stainless steel provided with a quartz liner 6 suitably shaped to provide a uniform exhaust restriction 54. The walls 6 include water cooling chambers 50 linked to a water inlet and a water outlet whereby cooling water may be passed through the reactor walls. As in the case of the first embodiment, the upper end of the reactor is closed by a closure assembly of the general type described in FIGS. 2 to 5. In this case, the closure assembly includes a plurality of optical pyrometer ports 55 passing through the top closure plate 7 and through first plate 15, second plate 17, and third plate 19 and into the chamber 5. Each pyrometer port comprises a small diameter quartz rod 56 contained within a stainless steel tube 57 and used as an optical link to the pyrometer (not shown) for temperature measurement. The pyrometer is of a type which uses a broad band detector at wavelengths at which the substrate and deposited layers are transparent. In this way, interference effects are reduced. By having multiple pyrometer ports, temperature uniformity can be determined. Each port 55 includes an inlet 58 whereby a small quantity of hydrogen or inert gas can be introduced between the stainless steel tube 57 and the quartz rod 56 to prevent deposition (from the reactive gases used in the process) on the end of the quartz rod.

The closure assembly includes first and second inlets 27 and 29, respectively, for introducing first and second gaseous precursors into the reaction chamber 5. First inlet 27 communicates with the first chamber 16 located between cover plate 7 and first plate 15 and linked to the reaction chamber 5 by first conduits 21. Second inlet 29 communicates with the second chamber 18 located between first plate 15 and second plate 17 and linked to the reaction chamber 5 by second conduits 24. The closure assembly includes an inlet 31 and an outlet 35 to enable water to be continuously passed through the injector assembly 8.

A substrate 4 in the form of one or more wafers is located in the reaction chamber 5 and is mounted on a support hearth 61 manufactured from a material which is compatible with the reagents being used. For example, graphite coated with silicone carbide is a typical material which may be used. The hearth 61 and any separate wafer holders which may be present are profiled so as to provide good temperature uniformity. The hearth 61 is mounted on a cylinder 62 attached to a rotating tube 63 of a double magnetic rotary seal 64 mounted for rotation on a static base plate 65. The support hearth 61, rotating tube 63, magnetic rotary seal 64 and base plate 65 effectively define an enclosure within which is contained a heater 66 manufactured from a refractory material, typically graphite. The heater is preferably in the form of a pancake induction coil and has a hot top surface to heat the support hearth 61 and robust integral terminals to enable electrical contact to be made at a cooler part of the heater. The heater may include separate sections so as to improve the temperature uniformity when large hearths are used to process multiple wafers. The enclosure protects the heater from the reagents being used and radiation shields 67 are provided to prevent heating of the magnetic rotary seal 64. The terminals of the heater 66 are electrically connected to water cooled electrical conductors 68. The enclosure for the heater 66 includes a port (not shown) in the base plate 65 whereby it may be purged with hydrogen or an inert gas. An exhaust port 69 is provided in communication with the reaction chamber 5 via the restriction 54. The exhaust port 69 may be in communication with the atmosphere or be connected to a low pressure exhaust system.

If desired, the apparatus may be inverted so that the substrate 4 is facing downwards.

In use the first and second precursors are injected into the reaction chamber 5 via first and second inlets 27 and 29. Thus the precursors are kept separate and cool until they enter the reaction chamber 5 and approach the surface of the heated wafer(s) where they are rapidly mixed together so that the chemical vapour deposition reaction takes place at the heated surface and a layer of the desired material is deposited on the surface.

We claim:

1. A reactor for producing a material from first and second gaseous precursors by metal organic chemical vapour deposition which reactor comprises:

(i) a reaction chamber for accommodating a heated substrate having a surface upon which said material is to be deposited by reaction of said precursors.

(ii) a first chamber for the first precursor, (iii) a second chamber for the second precursor, (iv) a plurality of first conduits connecting the first chamber with outlets in the reaction chamber to provide discrete paths along which the first precursor can pass to the reaction chamber, (v) a plurality of second conduits connecting the second chamber with outlets in the reaction chamber to provide discrete paths along which the second precursor can pass to the reaction chamber whereby contact between said first and second precursors does not occur until the precursors enter the reaction chamber the outlets of the first and second conduits being uniformly distributed so that the outlet of each first conduit is surrounded by the outlets of several of the second conduits and vice versa, and (vi) a means for cooling said first and second conduits and comprising a coolant chamber through which the first and second conduits pass, the first and second conduits being disposed so that the first and second precursors enter the reaction chamber perpendicularly to the substrate surface, and the reactor including exhaust means causing the precursors to flow along the substrate surface when being exhausted from the reaction chamber.

2. A reactor as claimed in claim 1 wherein the first conduits pass through the second chamber.

3. A reactor as claimed in claim 2 wherein the first and second chambers share a common dividing wall.

4. A reactor as claimed in claim 1, 2 or 3 which includes a third chamber for additional gas and a plurality of third conduits provided between the third chamber and the reaction chamber to provide discrete paths along which the additional gas can pass to the reaction chamber.

* * * * *